(12) United States Patent
Ando et al.

(10) Patent No.: US 7,436,179 B2
(45) Date of Patent: Oct. 14, 2008

(54) MAGNET DEVICE

(75) Inventors: Ryuya Ando, Hitachi (JP); Mitsushi Abe, Hitachinaka (JP); Takeshi Nakayama, Hitachinaka (JP); Tsutomu Yamamoto, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/513,375

(22) Filed: Aug. 31, 2006

(65) Prior Publication Data

US 2007/0057667 A1 Mar. 15, 2007

(30) Foreign Application Priority Data

Sep. 1, 2005 (JP) ............... 2005-253327

(51) Int. Cl.
*G01V 3/00* (2006.01)
(52) U.S. Cl. ....................................... 324/318; 335/296
(58) Field of Classification Search ......... 324/300–322; 335/316, 299, 3, 296; 600/407–445
See application file for complete search history.

(56) References Cited

U.S. PATENT DOCUMENTS 4,931,735 A 6/1990 Overweg et al.
5,329,266 A 7/1994 Soeldner et al.
6,570,475 B1 5/2003 Lvovsky et al.

FOREIGN PATENT DOCUMENTS

| EP | 0299325 | 7/1988 |
|----|---------|--------|
| EP | 0468425 | 1/1998 |
| EP | 0601648 | 9/1998 |
| JP | 4-299275 | 10/1992 |
| JP | 7-005235 | 1/1995 |
| JP | 8-162316 | 6/1996 |
| JP | 2001-196219 | 7/2001 |

*Primary Examiner*—Brij B Shrivastav
(74) *Attorney, Agent, or Firm*—Mattingly, Stanger, Malur & Brundidge, P.C.

(57) ABSTRACT

A magnet device has main coils in a pair positioned facing each other to form a static magnetic field space in between and external magnetic flux shielding coils placed coaxially to the main coils. The external magnetic flux shielding coils have a first coil group having a small coefficient of coil coupling and a second coil group having a coefficient of coil coupling greater than that of the first coil group. The first coil group is connected in series to the second coil group. External magnetic flux entering the magnetic field imaging space formed by main coils in a pair positioned facing each other is effectively warded off.

13 Claims, 4 Drawing Sheets

MAGNET DEVICE

CLAIM OF PRIORITY

The present application claims priority from Japanese application serial no. 2005-253327, filed on Sep. 1, 2005, the content of which is hereby incorporated by reference into this application.

BACKGROUND OF THE INVENTION

The present invention relates to a magnet device, for instance, a magnet device used for magnetic resonance imaging apparatus because of its formation of a static magnetic field space between main coils in a pair positioned facing each other.

Magnetic resonance imaging apparatus uses nuclear magnetic resonance phenomena taking place when a test object (examinee) placed in a static magnetic field space is emitted a high-frequency pulse and thus can obtain images representing the physical and chemical properties of the test object. Accordingly, the magnetic resonance imaging apparatus are now in use particularly for medical purposes. The magnetic resonance imaging apparatus (hereinafter MRI apparatus) are in general made up chiefly of a magnet device for working as a magnetic field generation source for applying a static magnetic field within the imaging region where the test object is carried to, an RF coil for emitting high-frequency pulses toward the imaging region, a receiving coil for receiving responses from the imaging region and a gradient magnetic field coil for applying a gradient magnetic field for giving positional information on resonance phenomena in the imaging region.

To enhance the image quality of an MRI apparatus, it is demanded to increase the homogeneity of magnetic field in the imaging space. For instance, in the magnet device of the MRI apparatus, the entrance to the imaging region of external magnetic flux caused by another magnetic field generation source impairs the homogeneity of the magnetic field. This necessitates the warding-off of the external magnetic flux.

To ward off such external magnetic flux, a magnet device of the style in which a cylindrical magnet has horizontally directed magnetic fields generating in it has been treated with various solutions. For instance, in EP0299325B1 describes an external magnetic flux warding-off method in which a bridge cable is used to short-circuit the coil generating a magnetic field in the same direction as the static magnetic field and the coil generating a magnetic field in the opposite direction as the static magnetic field. JP3447090B describes an external magnetic flux warding-off performance optimizing method in which a bridge cable is used to tap in the middle of the coil winding for short-circuiting. But it is not easy to manufacture a magnet so constructed that a coil series, particularly, windings are tapped using a bridge cable.

On the other hand, U.S. Pat. No. 4,931,735 and JP2001-196219A describe an external magnetic flux warding-off method in which a main coil for working as a magnetic field generation source is provided with a shielding coil to ward off external magnetic flux. U.S. Pat. No. 4,931,735 describes a method in which a magnet device has a solenoid-shaped shielding coil built into it. JP2001-196219A describes a construction in which a cylindrical shielding coil is placed coaxially to a main coil, sharing a persistent current switch control power source with the main coil. These methods pose a problem in that a magnet device tends to have undesirably long axial length. For this reason, U.S. Pat. No. 5,329,266 describes a method in which a main coil have a shielding coil with desirably few turns of winding placed in its vicinity and connected in series so that both of them can generate magnetic fields in the same direction. JP3043494B describes a method in which a plurality of shielding coil different in radius are built in.

SUMMARY OF THE INVENTION

Said shielding coil building-in methods are all effective for a cylindrical magnet device generating magnetic fields in a horizontal direction. But in the magnet device of the open-style MRI apparatus having magnetic field sources facing each other and forming a magnetic field imaging space in between, there has been a problem in that it is impossible to obtain sufficient shielding.

With the magnet device in the open-style MRI apparatus, there unavoidably is a long distance between the imaging space and the shielding coils. For this reason there has been a problem in that the performance of warding off external magnetic flux in the imaging space is low. Simply increasing the number of the turns of winding of these external magnetic field shielding coils in order to strengthen the magnetic fields generated by them leads to a rise in the inductance of the coils. Thus, the electrical current induced by external magnetic fields reduces, and the performance of warding off the external magnetic flux ends up with no increase.

The object of the present invention, therefore, is to effectively ward off external magnetic flux entering the imaging space of the static magnetic field formed by main coils in a pair positioned facing each other.

To achieve the above-mentioned object, it is characterized that a magnet device of the present invention is provided with main coils in a pair positioned facing each other to form a static magnetic field space in between and external magnetic flux shielding coils placed coaxially to the main coils to ward off external magnetic flux, wherein the external magnetic flux shielding coils have a first coil group having a small coefficient of coil coupling and a second coil group having a coefficient of coil coupling greater than that of the first coil group, and the first coil group is connected in series to the second coil group.

That is to say, since the first coil group having a small coefficient of coil coupling has a small inductance, the current induced by external magnetic flux is the larger for it. Here, the induced current is directed in such a way that magnetic fields are generated to ward off external magnetic flux. When this induced current flows into the second coil group having a greater coefficient of coil coupling, magnetic fields are generated which are strong enough to ward off external magnetic flux. This allows effective warding-off of external magnetic flux that enters the imaging space of the static magnetic field. In addition, it possible that the second coil group, though keeping its external magnetic flux warding-off still effective, is as a whole small in inductance, because the inductance of the first coil group become small.

In this case, it is preferable that the second coil group is positioned closer to the static magnetic field space than the first coil group. The intensity of the magnetic fields warding-off the external magnetic flux and generated by the external magnetic flux shielding coils is inversely proportional to the distance. For this reason, positioning the second coil group, which is greater in the coefficient of coil coupling and capable of generating stronger magnetic fields, in a position closer to the static magnetic field allows still effective warding-off of external magnetic flux entering the static magnetic field imaging space.

Here, it will be more preferable that the external magnetic flux shielding coils are superconducting coils. As a result of this, when the presence of external magnetic flux continues and induced currents continue without reducing, the magnetic fields generated by the external magnetic flux shielding coils continue without reducing, too. Thus the external magnetic flux entering the magnetic field imaging space is effectively warded off.

Furthermore, a magnet device of the present invention is constructed in such a way that it has main coils in a pair positioned facing each other to form a static magnetic field space in between, an annular coil case for housing the main coils and external magnetic flux shielding coils placed coaxially to said main coils in at least one of an inside and an outside of the coil case, wherein the external magnetic flux shielding coils have a first coil group made up of a plurality of one-turn-coil being winded with a spacing in between and a second coil group made up of a plurality of one-turn-coil having turns of winding with a closer spacing in between than in the first coil group, and said first coil group is connected in series to said second coil group. This, in the same way as the aforementioned, makes it possible to effectively ward off external magnetic flux entering the static magnetic field imaging space.

In this case, the first coil group may be made up of winding along at least one of the inside and the outside of said coil case. Under condition that the temperature of the coil case is sufficiently low, the winding along the outside of the coil case makes it still possible to keep the superconducting state of the first coil group.

According to the present invention, it is possible to effectively ward off external magnetic flux entering the imaging space of the static magnetic field formed by main coils in a pair positioned facing each other.

DETAILED DESCRIPTION OF THE EMBODIMENTS

The embodiments of a magnet device applying the present invention will be explained based on the drawings as follow.

Figure 1:
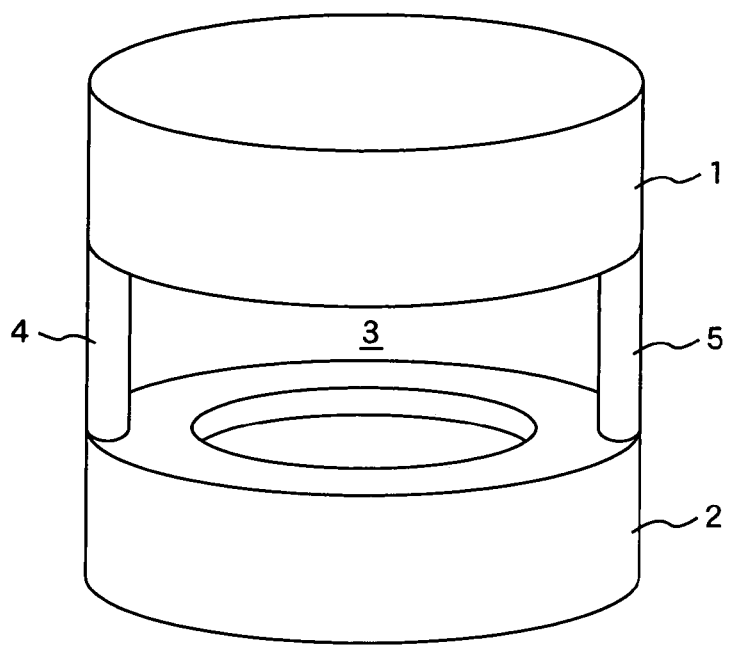
FIG. 1 is a perspective view of a magnet device in an embodiment of the present invention.
Figure 2:
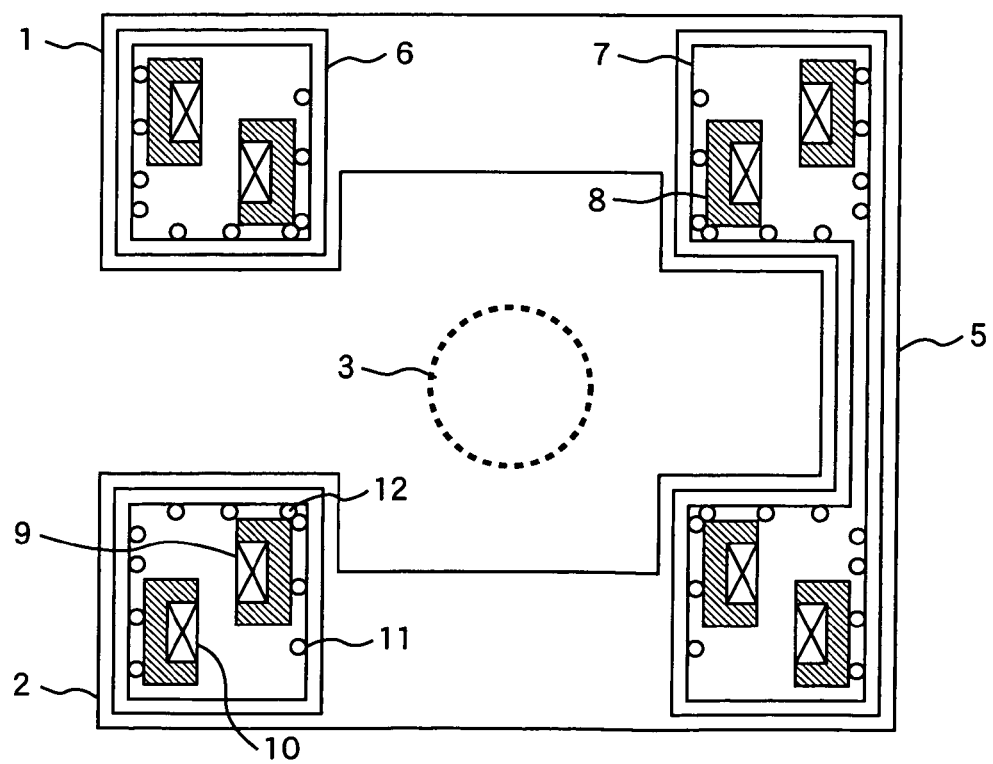
FIG. 2 is a vertical sectional view of the magnet device shown in FIG. 1.

FIG. 1 is a perspective view of a magnet device of a MRI apparatus in an embodiment 1 of the present invention. FIG. 2 is a vertical sectional view of the magnet device shown in FIG. 1.

The magnet device shown in FIG. 1 has magnetic field generation sources 1 and 2 including a pair of main coils and connecting by connecting posts 4 and 5. The magnetic field generation sources 1 and 2 arrange facing each other. The magnetic field generation sources 1 and 2 and the connecting post 5 are housed in a vacuum vessel. A radiation shield 6 is housed in the vacuum vessel. A coil case 7 is housed in the radiation shield 6. The main coils and external magnetic flux shielding coils are housed in the coil case 7 houses, together with such a cooling medium as liquid helium.

The main coils includes a main magnetic field generation coil 9, and a shield coil 10 which generates a magnetic field in the opposite direction to the main magnetic field in order to prevent magnetic flux from leaking outside. The main coils in a pair are placed facing each other to form a static magnetic field space 3.

Figure 3:
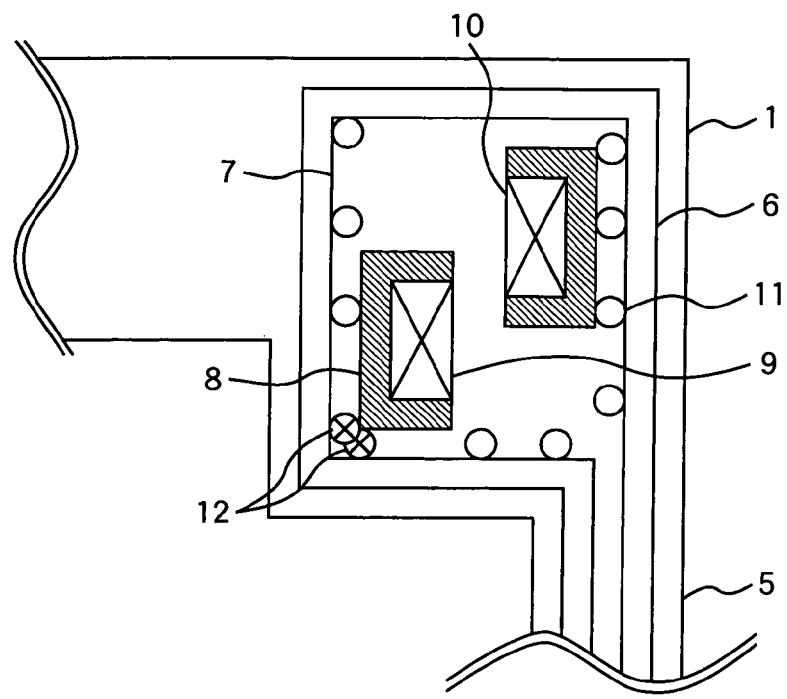
FIG. 3 is an enlarged vertical sectional view of an upper magnetic field generation source in a magnet device in the first embodiment of the present invention.

With reference to FIG. 3, now, external magnetic flux shielding coils in the embodiment 1 will be described. FIG. 3 is an enlarged vertical sectional view showing the upper magnetic field generation source 1.

The external magnetic flux shielding coils have a first coil group 11 including a plurality of one-turn-coil. The one-turn-coils are winding with a spacing in between and along the inside of the coil case 7. A second coil group 12 of the external magnetic flux shielding coils has two one-turn-coils having turns of winding with a closer spacing in between than in the first coil group on a inside corner portion in the vicinity of the static magnetic field space of the coil form 8 closest to the static magnetic field space in the same direction as the first coil group 11. The first coil group 11 is connected in series to the second coil group 12. The number of the turns of winding of the first coil group 11 is decided on in consideration of such design conditions as the size of the coil case 7.

Figure 4:
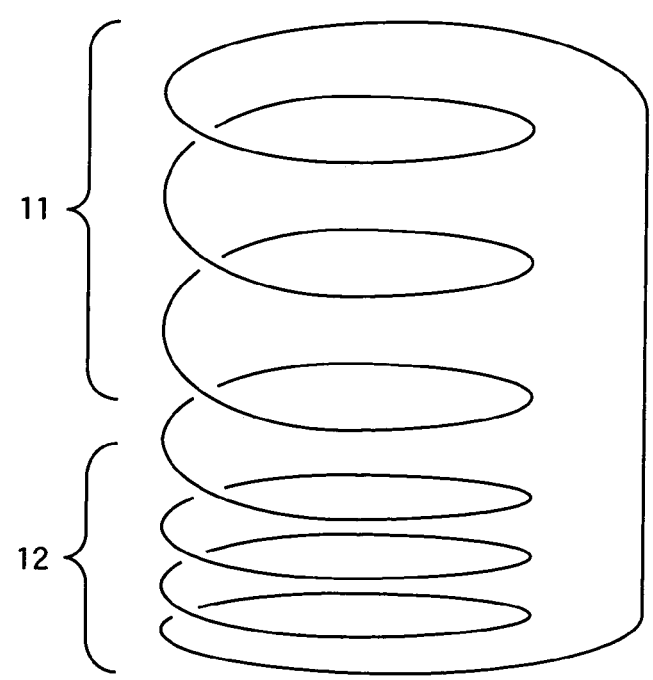
FIG. 4 is a schematic representation of external magnetic flux shielding coils.

The fundamental concept of the present invention for achieving the object of the present invention is embodied by a process in which, as shown in FIG. 4, the large current is induced by external magnetic flux in first coil group 11, this current is made to flow in the secondary coil 12, and thus a strong magnetic field is generated to ward off external magnetic flux. Now, this concept will be described in detail.

It is assumed that a coil having one turn of winding is placed in a space, that its self-inductance is L and that the external magnetic flux interlinking with L is $\phi$. Here, for the sake of simplicity, the following description will assume all the one-turn-coils to have the same inductance.

The current I induced by the external magnetic flux $\phi$ is given by the following.

$$I = \phi/L \tag{1}$$

If the one-turn-coils, which are null in the coefficient of coil coupling, having the inductance L are Na in number and also if these one-turn-coils are connected in series to form a loose coupled coil series a (the first coil group 11), self-inductance La and interlinking magnetic flux $\phi a$ of the loose coupled coil series a are expressed as follows.

$$La = Na \times L \tag{2}$$

$$\phi a = Na \times \phi \tag{3}$$

If the one-turn-coils having the inductance L are 1 in the coefficient of coil coupling and are Nb in number and also if these one-turn-coils are connected in series to form a close coupled coil series b (the second coil group 12), self-inductance Lb and interlinking magnetic flux $\Phi b$ of the close coupled coil series b are expressed as follows.

$$Lb = Nb \times Nb \times L \tag{4}$$

$$\Phi b = Nb \times \phi \tag{5}$$

The loose coupled coil series a and the close coupled coil series b are connected loosely in series to each other to form a total coil series c. Self-inductance Lc and interlinking magnetic flux Φc of the total coil series c are given by the following.

$$Lc = La + Lb = (Na + Nb \times Nb) \times L \quad (6)$$

$$\Phi c = \Phi a + \Phi b = (Na + Nb) \times \phi \quad (7)$$

Then, the current Ic induced by the external magnetic flux in the total coil series c is given by the following.

$$Ic = \Phi c / Lc = (Na + Nb) \times \phi / (Na + Nb \times Nb) \times L \quad (8)$$

Here, it is one feature of the present invention that larger current Ic is induced in the total coil series c. To achieve this, it is necessary to make the self-inductance Lc of the total coil series c as small as possible and at the same time the interlinking magnetic flux Φc as large as possible. It is understood that, according to the equation 6, in order to reduce the inductance Lc it is necessary to reduce the numbers Na and Nb, particularly Nb, and that, according to the equation 7, in order to increase the interlinking magnetic flux it is necessary to increase the numbers Na and Nb.

Another feature of the present invention is running of the current Ic induced by the external magnetic flux in the total coil series c through the close coupled coil series b in a position as close as possible to the static magnetic field space. In other words, it is positioning of the close coupled coil series b in a position as close as possible to the static magnetic field space and of the loose coupled coil series a in an area elsewhere. This is attributed to the principle that, when external magnetic flux induces a current in a coil, the magnetic field intensity generated by the coil because of the induced current is proportional to the number of the turns of winding of the coil and is inversely proportional to the distance.

Assuming that the proportion of the magnetic field intensity generated in the static magnetic field space by the loose coupled coil series a to that being ascribable to the close coupled coil series b is α (<1.0), magnetic field intensity Be generated by the total coil series c in the static magnetic field space is given by the following since it is proportional to the number of the turns of coil winding.

$$Be \propto (\alpha \times Na + Nb) \times (Na + Nb) \times \phi / (Na + Nb \times Nb) \times L \quad (9)$$

The close coupled coil series b is also related to the loose coupled coil series a in the number of the turns of winding, namely Nb is related to Na, where their proportion is, if designated by x, given by the following.

$$x = Nb / Na \quad (10)$$

From the equations 9 and 10, the following is obtained.

$$Be \propto (x + a) \times (x + 1) \times \phi / (x \times x + 1 / Na) \times L \quad (11)$$

The equation 11 represents a function having its maximum value, so finding the value x here which gives the maximum value decides on an optimal proportion in which the loose coupled coil series a is related to the close coupled coil series b in the number of the turns of winding, namely Na is related to Nb.

Figure 7:
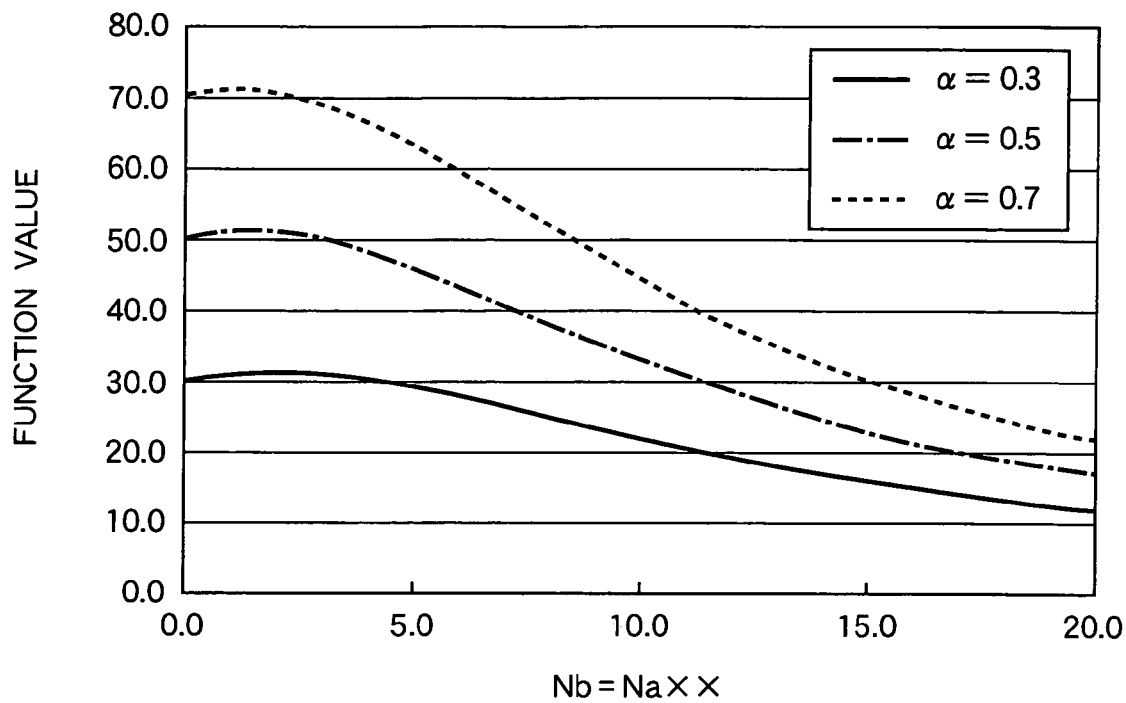
FIG. 7 is a graph of the function represented by the numerical equation 11.
Figure 8:
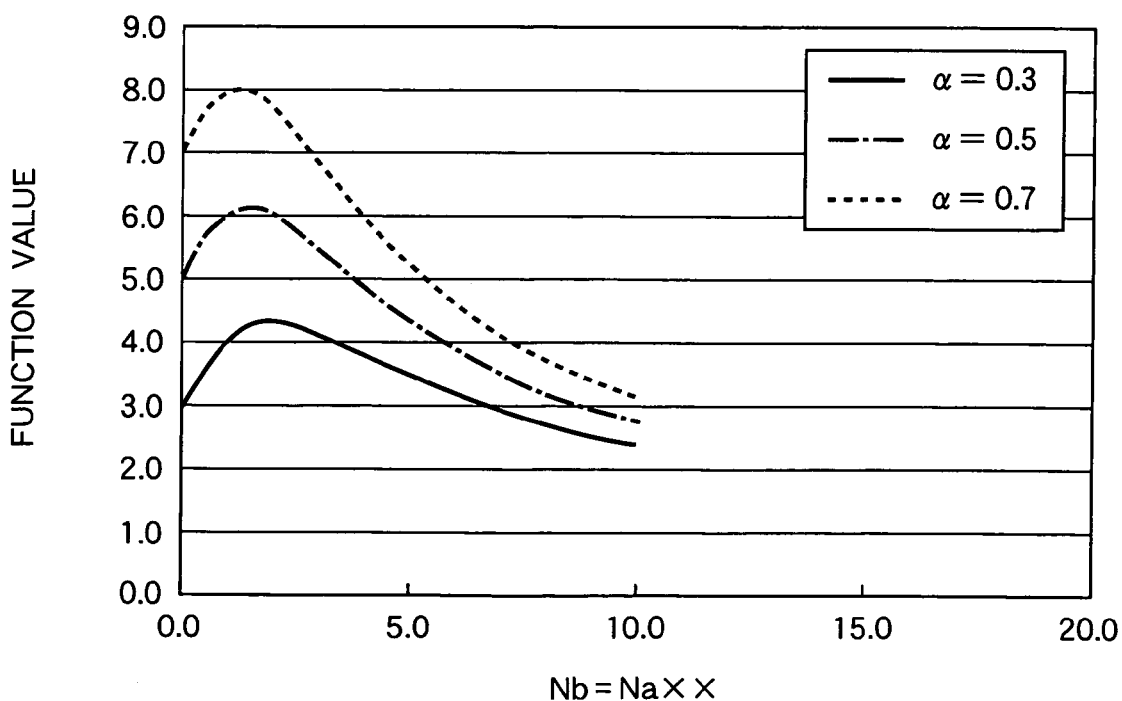
FIG. 8 is a graph of the function represented by the numerical equation 11.

FIG. 7 is a graph of the function represented by the equation 11 where Na=100 and where values of α are 0.3 to 0.7. FIG. 8 is a graph where Na=10 and where values of α are also 0.3 to 0.7. This graph has the coordinate pairs (X, Y) where the values of X and Y are the number Nb of the turns of winding of the close coupled coil series b and the magnetic field intensity Be generated by the total coil series c in the static magnetic field space respectively, with the latter being the performance index according to the invention.

From these two graphs, it is understood that, regardless of the number Na of the turns of winding of the loose coupled coil series a, it is appropriate to handle the value of α being 0.5 or more by choosing 1 or 2 for the number Nb of the turns of winding of the close coupled coil series b and to handle the value of α being less than 0.5 by choosing 2 or 3. Moreover, it is understood that unless by choosing at most 10 it will not be possible to implement performance equal to or higher than that when Nb=0.

In the above description, for the sake of simplicity, it has been assumed that the coefficient of coil coupling of the loose coupled coil series a is 0 and that of the close coupled coil series b is 1. But the actual coefficient of coil coupling ranges 0 to 1. Where loose coupling is separated from close coupling depends on the definition and is not the point in question here. But as an example the intermediate value 0.5 can be specified for the boundary. Even setting no boundary and only addressing a relative state in which the coefficient of coil coupling of the loose coupled coil series a is smaller than that of the close coupled coil series b may not lose the above described rationality.

Based on the above description, the external magnetic flux shielding coils in this embodiment of the invention are made possible.

According to this embodiment, the current induced by external magnetic flux is greater, when this induced current is made to flow into the second coil group 12 having a greater coefficient of coil coupling and being positioned closer to the static magnetic field space than the first coil group 11, magnetic fields are generated which are strong enough to ward off external magnetic flux. This allows effective warding-off of external magnetic flux that enters the magnetic field imaging space formed by main coils in a pair positioned facing each other.

The first coil group 11 and the second coil group 12 are both made up of winding along the inside of the coil case 7, so the external magnetic flux shielding coils are refrigerated with such a cooling medium as liquid helium into superconducting coils. When the presence of external magnetic flux continues, therefore, induced currents and also magnetic fields generated by the external magnetic flux shielding coils continue without reducing, leading to effective warding-off of external magnetic flux entering the magnetic field imaging space.

Figure 5:
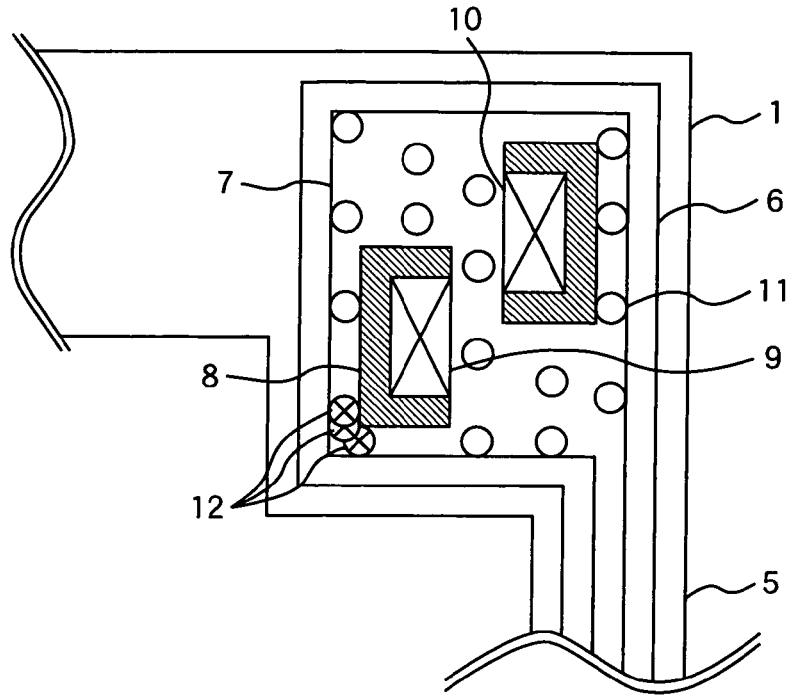
FIG. 5 is an enlarged vertical sectional view of an upper magnetic field generation source in a magnet device in a second embodiment of the present invention.

Now, a second embodiment of the present invention, according to which a magnet device is provided, will be described with reference to FIG. 5. FIG. 5 is an enlarged vertical sectional view showing the upper magnetic field generation source. See the perspective view regarding the first embodiment because it is the same as one regarding the second embodiment.

In this embodiment, external magnetic flux shielding coils have a first coil group 11 having more than one one-turn-coil having turns of winding with a spacing in between in all the space inside a coil case 7 and a second coil group 12 having three one-turn-coils having turns of winding with a closer spacing in between than in the first coil group on a inside corner portion in the vicinity of the static magnetic field space of the coil form 8 closest to the static magnetic field space in the same direction as the first coil group 11. The first coil group 11 is connected in series to the second coil group 12.

As understood from the above, the first coil group 11 may have winding not only along the inside of the coil case 7 but in all the space inside the coil case. In addition, for the second coil group, triple-winding coils may be used. All these alternatives allow effective warding-off of external magnetic flux entering the magnetic field imaging space.

Figure 6:
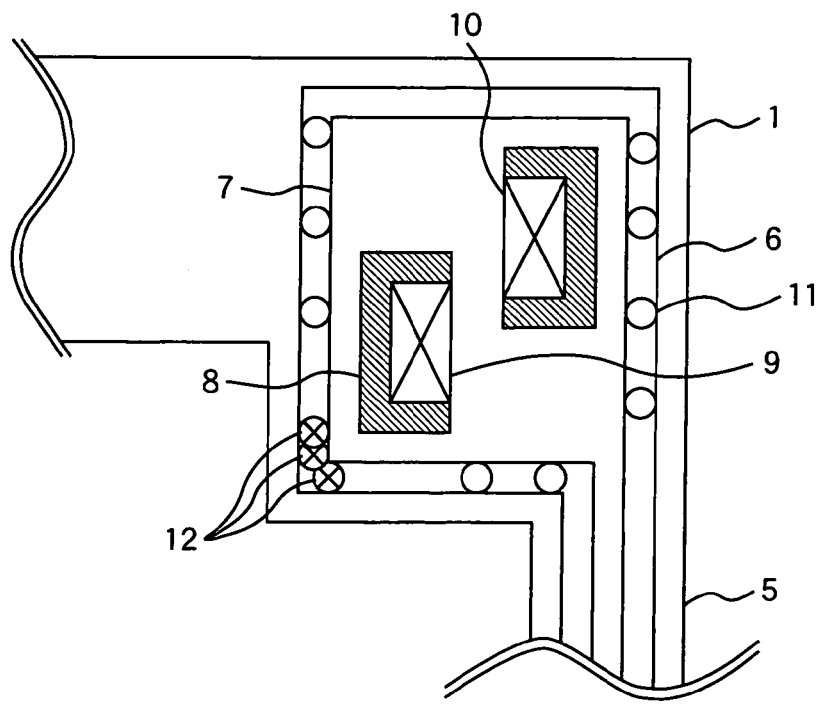
FIG. 6 is an enlarged vertical sectional view of an upper magnetic field generation source in a magnet device in a third embodiment of the present invention.

Now, a third embodiment of the present invention, according to which a magnet device is provided, will be described with reference to FIG. 6. FIG. 6 is an enlarged vertical sectional view showing the upper magnetic field generation source. See the perspective view regarding the first embodiment because it is the same as one regarding the second embodiment.

In this embodiment, external magnetic flux shielding coils have a first coil group 11 having more than one one-turn-coil having turns of winding with a spacing in between along the outside of a coil case 7 and a second coil group 12 having three one-turn-coils having turns of winding with a closer spacing in between than in the first coil group on a outside corner portion of the coil case 7 closest to a static magnetic field space in the same direction as the first coil group 11. The first coil group 11 is connected in series to the second coil group 12. The coil case 7 has inside it such a cooling medium as liquid helium, so its outside is expected to be at a sufficiently low temperature. This makes it possible, even if external magnetic flux shielding coils are placed not inside but outside the coil case 7, to keep the superconducting state of the first coil group.

In this embodiment, the second coil group 12 having a greater coefficient of coil coupling is positioned closer to the static magnetic field space, so it can be expected to effectively ward off external magnetic flux entering the magnetic field imaging space.

What is claimed is:

1. A magnet device comprising:
a first magnetic field generation apparatus having a first annular coil case in which a cooling medium is filled;
a second magnetic field generation apparatus arranged facing apart from the first magnetic field generation apparatus having a second annular coil case in which the cooling medium is filled; and
a connecting member connecting the first magnetic field generation apparatus and the second magnetic field generation apparatus to each other,
wherein each of said first and second magnetic field generation apparatuses includes a main coil,
wherein said main coils of said first and second magnetic field generation apparatuses are positioned facing each other to form a static magnetic field space in between;
wherein each of said first and second magnetic field generation apparatuses further includes external magnetic flux shielding coils placed between said main coil and the annular coil case,
wherein said main coil and the external magnetic flux shielding coils of each of said first and second magnetic field generation apparatuses are arranged in the annular coil case,
wherein the external magnetic flux shielding coils of each of said first and second magnetic field generation apparatuses have a first coil group and a second coil group having a coefficient of coil coupling greater than that of the first coil group, and said first coil group is connected in series to said second coil group.

2. A magnet device according to claim 1, wherein said second coil group is positioned closer to said static magnetic field space than said first coil group.

3. A magnet device according to claim 2, wherein said second coil group is arranged in the first annular coil case and wound on an inside corner portion in the vicinity of said static magnetic field space and is used for said main coil closest to said static magnetic field space of said main coils.

4. A magnet device according to claim 1, wherein said second coil group has at least 2 turns and up to 10 turns of winding.

5. A magnet device according to claim 1, wherein the coefficient of coil coupling of said first coil group are less than 0.5, and the coefficient of coil coupling of said second coil group are 0.5 or more.

6. A magnet device comprising:
a first magnetic field generation apparatus having a first annular coil case in which a cooling medium is filled;
a second magnetic field generation apparatus arranged facing apart from the first magnetic field generation apparatus having a second annular coil case in which the cooling medium is filled; and
a connecting member connecting the first magnetic field generation apparatus and the second magnetic field generation apparatus to each other,
wherein each of said first and second magnetic field generation apparatuses includes a main coil,
wherein said main coils of said first and second magnetic field generation apparatuses are positioned facing each other to form a static magnetic field space in between and each is arranged in the annular coil case;
wherein each of said first and second magnetic field generation apparatuses further includes external magnetic flux shielding coils arranged in the annular coil case and placed between said main coil and the annular coil case in at least one of an inside and an outside of the annular coil case,
wherein the external magnetic flux shielding coils of each of said first and second magnetic field generation apparatuses have a first coil group made up of a plurality of one-turn-coils being wound with a spacing in between and a second coil group made up of a plurality of one-turn-coils having turns of winding with a closer spacing in between than in the first coil group, and said first coil group is connected in series to said second coil group.

7. A magnet device according to claim 6, wherein said first coil group is made up of winding along at least one of the inside and the outside of said annular coil case.

8. A magnet device according to claim 6, wherein said second coil group is positioned closer to said static magnetic field space than said first coil group.

9. A magnet device according to claim 8, wherein said second coil group is wound on an inside angle portion in the vicinity of said static magnetic field space of said main coil closest to said static magnetic field space of said main coils housed in said annular coil case.

10. A magnet device according to claim 8, wherein said second coil group is wound on an outside corner portion of said annular coil case closest to said static magnetic field space.

11. A magnet device according to claim 1, wherein the first and second coil groups are made up of a plurality of one-turn-coils.

12. A magnet device comprising:
a first magnetic field generation apparatus having a first annular coil case in which cooling medium is filled and a first radiation shield surrounding said first annular coil case;
a second magnetic field generation apparatus arranged facing apart from the first magnetic field generation apparatus having a second annular coil case in which the cooling medium is filled and a second radiation shield surrounding said second annular coil case; and a connecting member connecting the first magnetic field generation apparatus and the second magnetic field generation apparatus to each other, wherein each of said first and second magnetic field generation apparatuses includes a main coil, wherein said main coils of said first and second magnetic field generation apparatuses are positioned facing each other to form a static magnetic field space in between, wherein each of said first and second magnetic field generation apparatuses further includes external magnetic flux shielding coils placed between said coil case and said radiation shield, wherein said main coils of each of said first and second magnetic field generation apparatuses are arranged in the annular coil case, and wherein the external magnetic flux shielding coils of each of said first and second magnetic field generation apparatuses having a first coil group and a second coil group having a coefficient of coil coupling greater than that of the first coil group, and said first coil group is connected in series to said second coil group.

13. A magnet device according to claim 12, wherein said external magnetic flux shielding coils of each of said first and second magnetic field generation apparatuses are arranged on the outside of said annular coil case.

* * * * *